(12) United States Patent
Childress et al.

(10) Patent No.: US 6,577,476 B1
(45) Date of Patent: Jun. 10, 2003

(54) FLUX GUIDE STRUCTURE FOR A SPIN VALVE TRANSISTOR WHICH INCLUDES A SLIDER BODY SEMICONDUCTOR LAYER

(75) Inventors: Jeffrey Robinson Childress, San Jose, CA (US); Robert Edward Fontana, Jr., San Jose, CA (US); Jeffrey Scott Lille, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/108,688

(22) Filed: Mar. 28, 2002

(51) Int. Cl.[7] .................................................. G11B 5/39
(52) U.S. Cl. ............................. 360/324.11; 360/324.2
(58) Field of Search ........................ 360/324.11, 324.2

(56) References Cited

U.S. PATENT DOCUMENTS

| | | |
|---|---|---|
| 5,432,373 A | 7/1995 | Johnson |
| 5,747,859 A | 5/1998 | Mizushima et al. |
| 5,898,547 A * | 4/1999 | Fontana, Jr. et al. |
| 5,973,334 A | 10/1999 | Mizushima et al. |
| 5,991,125 A * | 11/1999 | Iwasaki et al. |
| 6,218,718 B1 | 4/2001 | Gregg et al. |

FOREIGN PATENT DOCUMENTS

| | | |
|---|---|---|
| JP | 3011669 | 1/1991 |
| JP | 4119671 | 4/1992 |
| JP | 5013781 | 1/1993 |
| JP | 5136432 | 6/1993 |
| RU | 2122258 | 11/1998 |
| RU | 2140117 | 10/1999 |

* cited by examiner

*Primary Examiner*—Craig A. Renner
(74) *Attorney, Agent, or Firm*—John J. Oskorep (57) ABSTRACT

A spin valve transistor (SVT) for a magnetic head and a method of making the same are described. A slider of a disk drive is formed of a semiconductor material, such as silicon. A free layer is formed over the semiconductor material and a magnetic pinned layer is formed over a portion of the free layer. The free layer has an edge that is substantially flush with an air bearing surface (ABS) between the magnetic head and the disk, whereas the magnetic pinned layer has an edge that is recessed away from the ABS. Advantageously, since the free layer serves as a flux guiding structure for the sensor, the sensor has a thinner profile at the ABS to accommodate higher recording densities.

35 Claims, 10 Drawing Sheets

FIG. 24

FLUX GUIDE STRUCTURE FOR A SPIN VALVE TRANSISTOR WHICH INCLUDES A SLIDER BODY SEMICONDUCTOR LAYER

BACKGROUND OF THE INVENTION

1. Field of the Invention

This invention relates generally to spin valve transistors (SVT) for magnetic read heads and methods of making the same.

2. Description of the Related Art

A spin-valve transistor (SVT) is a hybrid device in which ferromagnetic and semiconductor materials have been functionally integrated. The SVT is based on spin-dependent transport but, unlike other magnetoresistive devices, it relies on the spin-transport of a portion of transmitted electrons which are energetic "hot" electrons. Similar to a transistor, a conventional SVT has three terminals which include a base, emitter, and collector. In the SVT, the collector is made from semiconductor materials (such as silicon) but the other materials are magnetic and contain an anti-ferromagnet. In principle, a wide range of semiconductor and magnetic materials may be utilized. At the interface between the metal base and the semiconductor, an energy barrier (or "Schottky" barrier) is formed. To obtain a high-quality Schottky barrier which has a good rectifying behavior, thin layers of platinum and gold, for example, are incorporated at the emitter and collector side, respectively. These layers also separate the magnetic layers from the direct contact with silicon.

As described, several layers of materials form an SVT and GMR sensor. However, it has become increasingly important to reduce the profile of a read sensor such that higher recording densities can be achieved in magnetic media. Unfortunately, a simple reduction of materials or material thickness within the sensor adversely affects the sensor properties.

Accordingly, what is needed is a read sensor that has a thinner profile at the media interface so that higher recording densities can be achieved.

SUMMARY OF THE INVENTION

A spin valve transistor (SVT) for a magnetic head and a method of making the same are described. A slider of a disk drive is formed of a semiconductor material, such as silicon. The sensor has a free layer formed over the semiconductor material and a magnetic pinned layer formed over a portion of the free layer. The free layer has an edge that is substantially flush with an air bearing surface (ABS) of the magnetic head, whereas the magnetic pinned layer has an edge that is recessed away from the ABS. Advantageously, since the free layer serves as a flux guiding structure for the sensor, the sensor has a thinner profile at the ABS to accommodate higher recording densities.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 1:
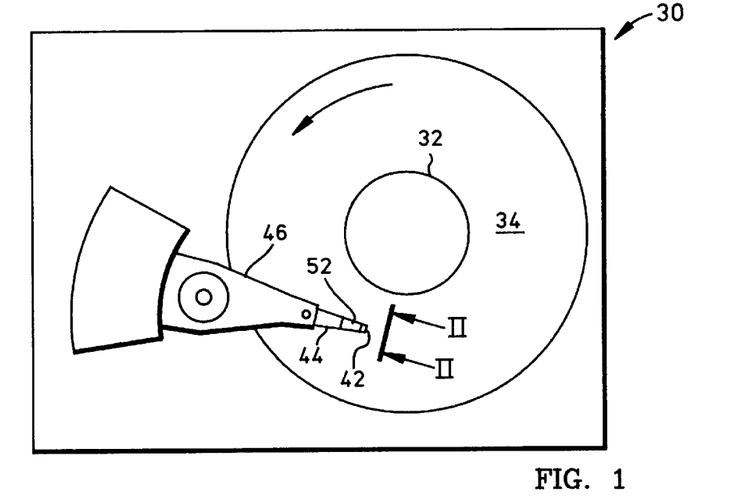
FIG. 1 is a planar view of an exemplary magnetic disk drive.
Figure 2:
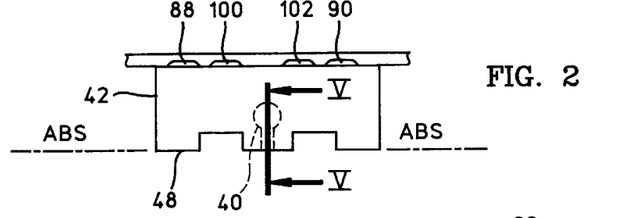
FIG. 2 is an end view of a slider with a magnetic head of the disk drive as seen in plane II—II of FIG. 1.
Figure 3:
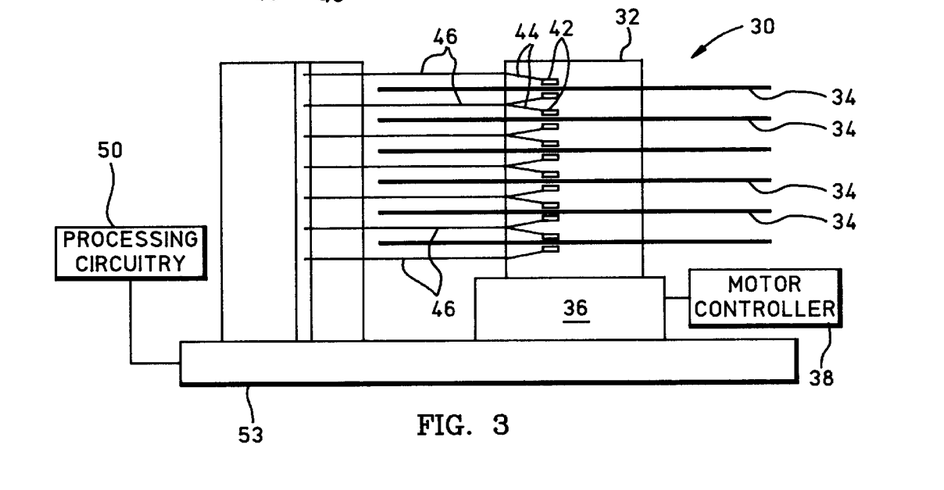
FIG. 3 is an elevational view of the magnetic disk drive wherein multiple disks and magnetic heads are employed.

Referring now to the drawings, wherein like reference numerals designate like or similar parts throughout the several views, as is illustrated in FIGS. 1–3 a magnetic disk drive 30. Disk drive 30 includes a spindle there that supports and rotates a magnetic disk 34. Spindle 32 is rotated by a motor 36 that, in turn, is controlled by a motor controller 38. A horizontal combined magnetic head 40 for reading and recording is mounted on a slider 42. Slider 42 is supported by a suspension 44 and actuator arm 46. A plurality of disks, sliders and suspensions may be employed in a large capacity direct access storage device (DASD), as shown in FIG. 3. Suspension 44 and actuator arm 46 position slider 42 to locate magnetic head 40 in a transducing relationship with a surface of magnetic disk 34. When disk 34 is rotated by motor 36, slider 42 is supported on a thin (typically, 0.02 micrometer) cushion of air (or air bearing) between disk 34 and an air bearing surface (ABS) 48.

Figure 4:
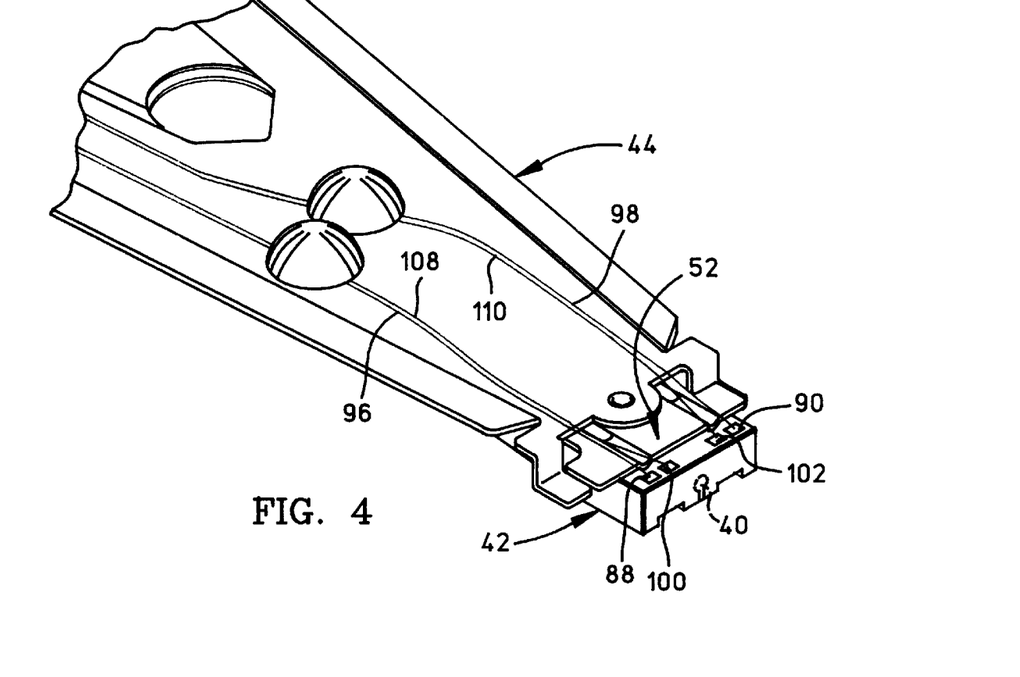
FIG. 4 is an isometric illustration of an exemplary suspension system for supporting the slider and magnetic head.

Magnetic head 40 may be employed for writing information to multiple circular tracks on the surface of disk 34, as well as for reading information therefrom. Processing circuitry 50 exchanges signals representing such information with magnetic head 40, provides motor drive signals, and also provides control signals for moving slider 42 to various tracks. In FIGS. 1 and 4, slider 42 is shown mounted to a head gimbal assembly (HGA) 52 that is mounted to suspension 44. All of the above components are supported on a base 53.

Figures 5, 7:
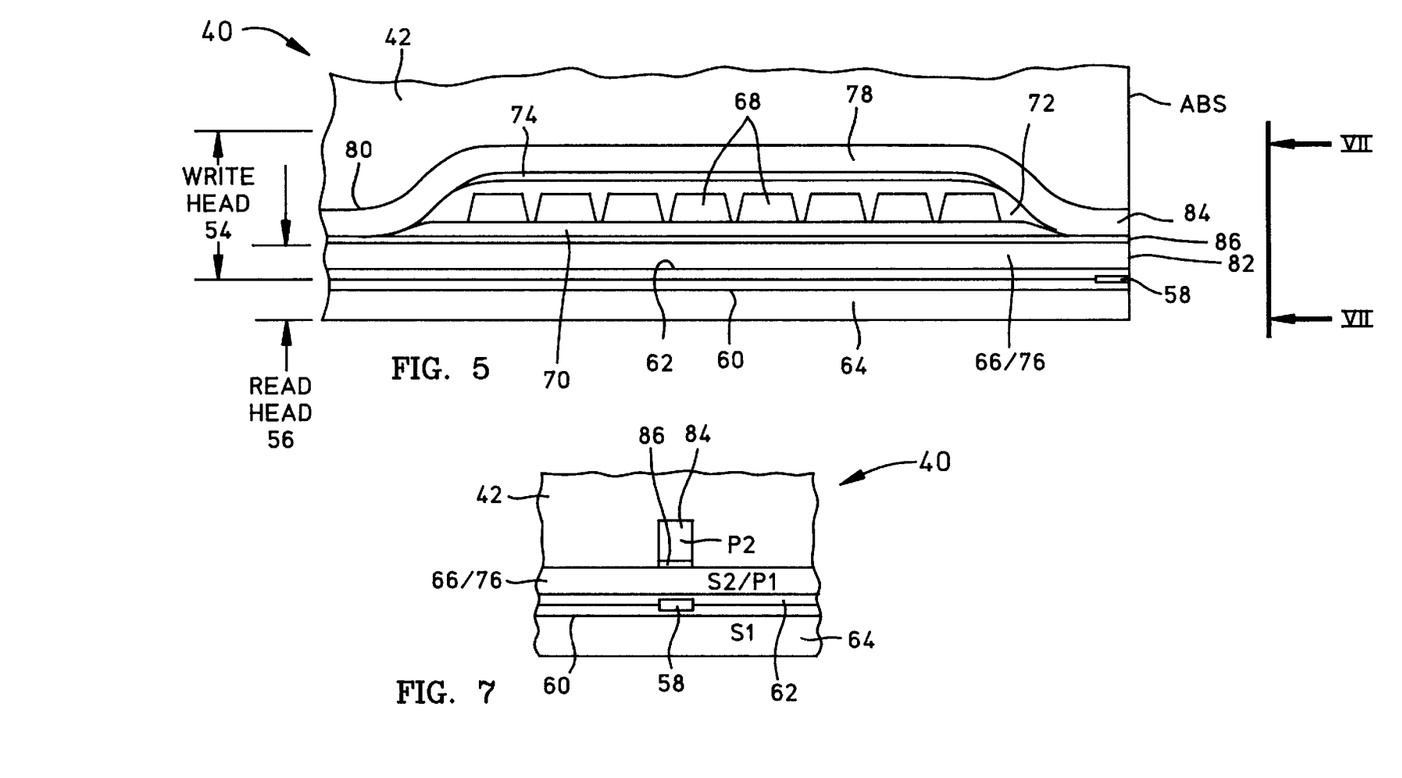
FIG. 5 is a partial elevation view of the slider and magnetic head as seen in plane V—V of FIG. 2.
FIG. 7 is a partial ABS view of the slider taken along plane VII—VII of FIG. 5 to show the read and write elements of the magnetic head.

FIG. 5 is a side cross-sectional elevation view of a merged read/write head 40 which has a write head portion 54 and a read head portion 56. Note also the partial ABS view of head 40 in FIG. 7. Read head portion includes a giant magnetoresistive read (GMR) sensor 58. GMR sensor 58 is sandwiched between first and second gap layers 60 and 62 that are, in turn, sandwiched between first and second shield layers 64 and 66. In response to external magnetic fields, the resistance of GMR sensor 58 changes. A sense current conducted through the sensor causes these resistance changes to be manifested as potential changes, which are processed by processing circuitry 50 (FIG. 3).

Figure 6:
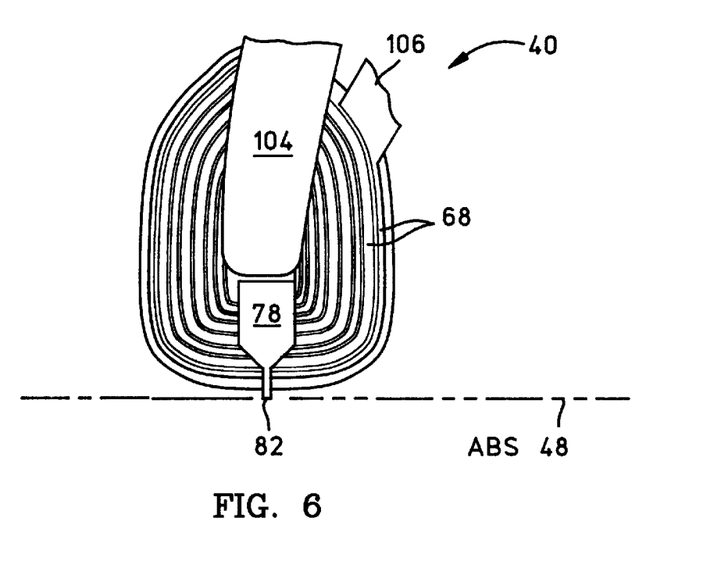
FIG. 6 is a top view of the second pole piece and coil layer, a portion of which is shown in FIG. 5, with all insulation material removed.

Write head portion 54 of the head includes a coil layer 68 sandwiched between first and second insulation layers 70 and 72. A third insulation layer 74 may be employed for planarizing the head to eliminate ripples in the second insulation layer caused by coil layer 68. The first, second and third insulation layers are referred to as an "insulation stack". Coil layer 68, and first, second and third insulation layers 70, 72 and 74, are sandwiched between first and second pole piece layers 76 and 78. The first and second pole piece layers 76 and 78 are magnetically coupled at a back gap 80, and have first and second pole tips 82 and 84 that are separated by a non-magnetic gap layer 86 at the ABS. As shown in FIGS. 2 and 4, a traditional head with first and second solder connections 88 and 100 connect leads (not shown) from GMR sensor 58 to leads 96 and 108 on suspension 44; third and fourth solder connections 90 and 102 connect leads 104 and 106 from coil 68 (see FIG. 6) to leads 98 and 110 on the suspension. A slider with an SVT may contain additional vias and leads on the suspension as well.

A method of making a spin valve transistor (SVT) for a GMR sensor and a magnetic read head is now described in relation to FIGS. 8–23. The SVT hereinafter described may be utilized more particularly in GMR sensor 58, magnetic head 40, and disk drive 30 of FIGS. 4–7 previously discussed.

Figure 8:
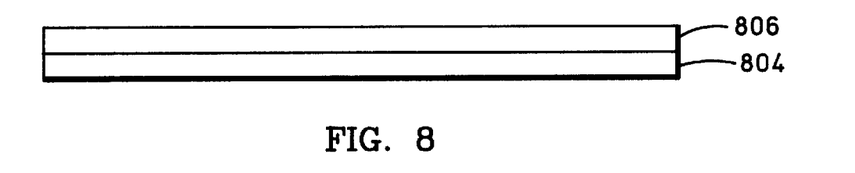
FIG. 8 is the first of a series of cross-sectional views relating to a method of making a spin valve transistor (SVT) for a magnetic read head, showing an oxide layer formed over a semiconductor material.

Referring first to FIG. 8, the method begins with use of a semiconductor material 804, such as silicon (Si), which is coated with a thin oxide layer, such as a silicon dioxide ($SiO_2$) layer 806. The silicon could alternatively be coated with nitride or an insulator. On the other hand, semiconductor material 804 may be an oxidized silicon wafer where silicon dioxide (or other) layer 806 is not needed for fabrication. In any case, semiconductor material 804 is preferably part of or integrally formed with a slider (such as slider 42 of FIG. 4) of the disk drive.

Figure 9:
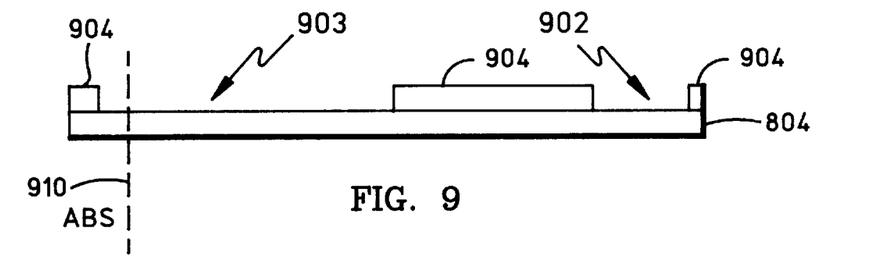
FIG. 9 is a cross-sectional view of that shown in FIG. 8 except that via holes are formed in the oxide layer.
Figure 10:
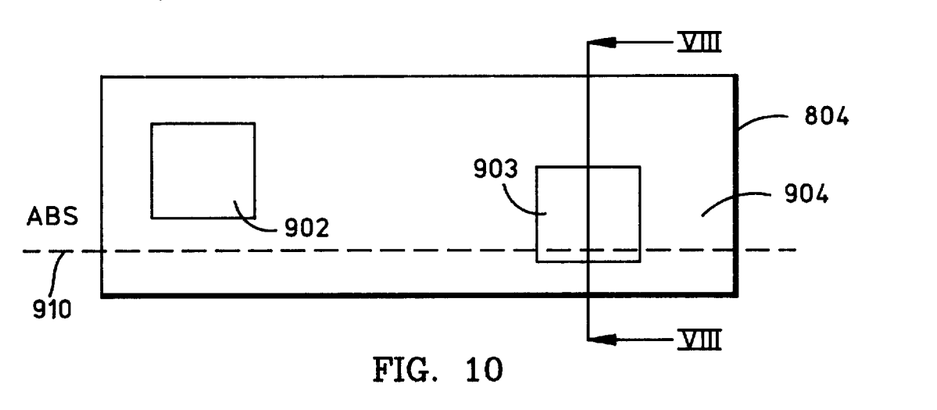
FIG. 10 is a top plan view of that shown in FIG. 9, where the vias are not shown along plane VII—VII.
Figure 11:
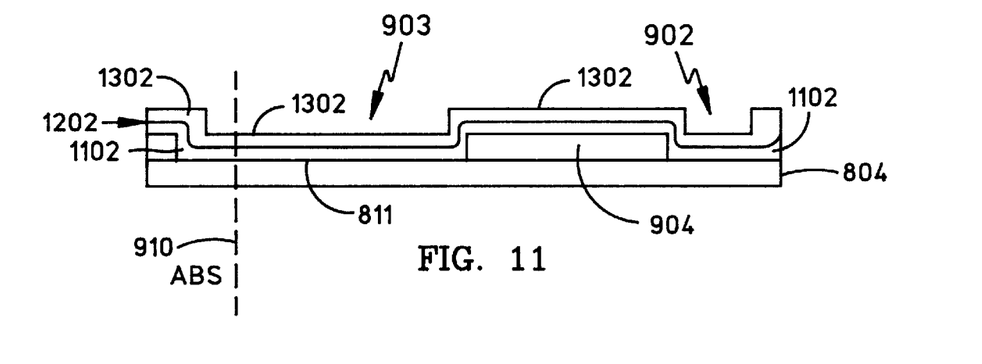
FIG. 11 is a cross-sectional view of that shown in FIG. 9 except that a pinned layer and a free layer is formed over the semiconductor material and oxide.

In FIG. 9, an air bearing surface (ABS) line 910 is contemplated for fabrication of the SVT and read head. Generally, the ABS is the media interface between the sensor and the media (e.g., disk) which stores the data. In this step, holes are patterned and formed through silicon dioxide layer 806 (FIG. 8) such that surface portions 902 and 903 of semiconductor material 804 are exposed and a silicon-dioxide portion 904 remains. This patterning and forming is done by photolithography and etching. The holes provide "vias" to semiconductor material 804, which forms the collector of the SVT. The frontmost hole relative to contemplated ABS line 910 is formed generally at the position shown in FIG. 9, and its length is based on the desired length of the free layer (which is deposited in the next step). FIG. 10 shows a top plan view of this resulting structure, where the vias to the substrate may or may not be in alignment. Sensor layer formation is now described. Prior to forming the sensor, however, a thin interfacial energy barrier (such as a Schottky barrier using a metal, e.g. CoFe, NiFe, Pt, or Au) is formed over semiconductor material 804. In FIG. 11, a free layer 1102 is then deposited over the exposed surface portions 902 of semiconductor material 804 (or the Schottky barrier 811) as well as silicon dioxide portions 904. Physical contact is made between free layer 1102 and semiconductor material 804 at its interface. As shown, free layer 1102 extends far enough to the left of the diagram to at least meet, and preferably extend through, contemplated ABS line 910. Preferably, free layer 1102 is formed of a soft magnetic material, such as nickel-iron (NiFe) or cobalt-iron (CoFe), which has a thickness between about 10–60 Angstroms. Thus, free layer 1102 is or includes a ferromagnet (FM). When the entire method is complete, free layer 1102 will serve as a flux guiding structure for the SVT at the media interface.

Figure 13:
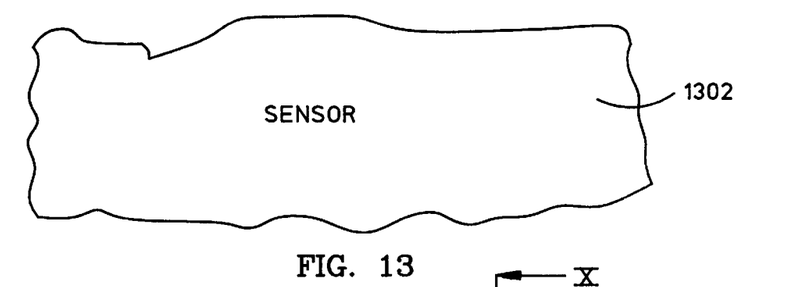
FIG. 13 is a top plan view of that shown in FIG. 12.

Also in FIG. 11, a barrier layer 1202 is deposited over free layer 1102. Preferably, barrier layer 1202 is formed of a thin metal oxide, such as aluminum-oxide ($Al_2O_3$), which has a thickness between about 4 and 20 Angstroms. Next, a magnetic pinned layer 1302 is deposited over barrier layer 1202. Magnetic pinned layer 1302 is a multi-layer structure which is preferably formed of nickel-iron (NiFe), cobalt-iron (CoFe), an antiferromagnetic (AFM) (e.g. PtMn), or a combination thereof, and has a total thickness between about 50–350 Angstroms. The depositing of free layer 1102, barrier layer 1104, and magnetic pinned layer 1302 is performed by vacuum deposition (e.g. ion beam deposition, sputtering, or evaporation) and may all be deposited in-situ. Note that, similar to free layer 1102, barrier layer 1202 and magnetic pinned layer 1302 at least meet and preferably extend through contemplated ABS line 910. FIG. 13 shows a top plan view of this structure after free layer 1102, barrier layer 1202, and magnetic pinned layer 1302 have been deposited across the entire wafer.

Figure 12:
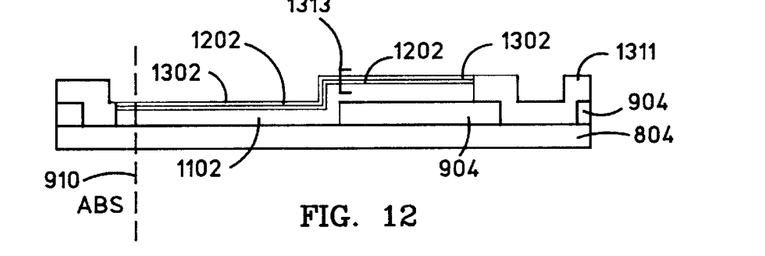
FIG. 12 is a cross-sectional view of that shown in FIG. 11 except that a magnetic pinned layer and a barrier layer are formed over the free layer, and an additional via lies along plane VIII—VIII of FIG. 10.

Once the entire sensor stack 1313 is deposited as in FIGS. 12–13, a masking and milling process is performed to define the track width. In this process, the entire stack thickness (which includes the free layer) is removed and replaced with an oxide (e.g. alumina). To accomplish this, a photoresist structure which acts as a milling or etch mask is utilized, and areas where sensor material was removed is subsequently refilled with an oxide. The oxide layer has a thickness that is on the same order as the deposited sensor thickness or less. Note that if oxide layer is too thick, the removal of the photoresist structure which defines the track width will be difficult and not manufacturable. After defining the track width and removing the photoresist structure, a cross-section of the wafer may resemble that shown in FIG. 12 and FIG. 14B. This shows that portions of sensor stack 1313 may or may not be in contact with substrate 804. Refilled oxide layer 1311 may have semiconductor material 804 or silicon dioxide portion 904 beneath it Note that the thickness of oxide layer 1311 is similar to the thickness of sensor stack 1313.

Figure 14A:
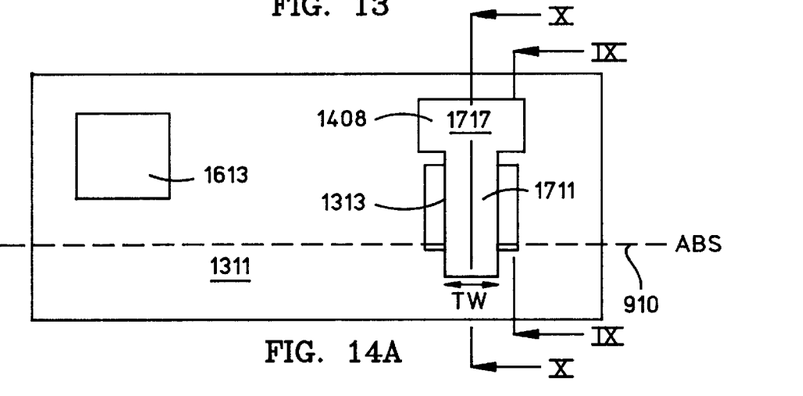
FIG. 14A is a top plan view of that shown in FIG. 12 except that a track width (TW) has been defined with a masking and milling process.
Figure 14B:
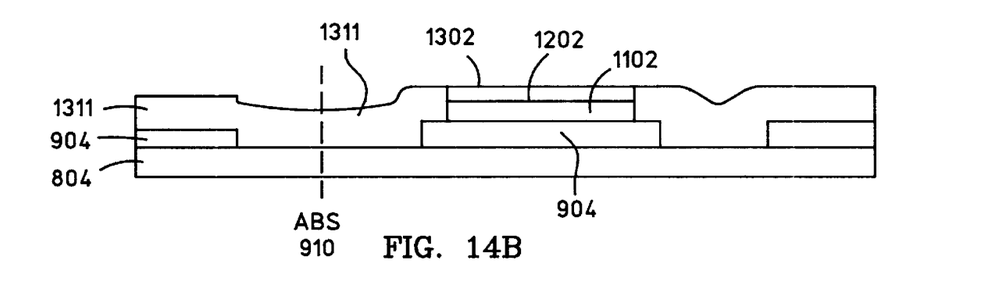
FIG. 14B is a cross-sectional view of that shown in FIG. 14A where an additional via to the substrate lies along the plane IX—IX of FIG. 14A.

A top-down view of the wafer at this point in the process is shown in FIG. 14A. A top 1408 of sensor stack 1313 is exposed on the top of the wafer after the photoresist mask is removed. A majority of the wafer is covered with refilled alumina 1311. A portion of refilled alumina 1311 adjacent to sensor stack 1313 is disposed through contemplated ABS line 910. Other areas of the wafer also have refilled alumina deposited on the substrate, which can include future via locations on wafer 1613. At this point in the process, sensor stack material 1313 consists of two regions. The first region is a narrow sensor region 1711 and the second region is a back region 1717. A portion of unremoved sensor stack material may exist in back sensor region 1717 so that a future via connection can be made to a portion of sensor stack 1313. A future via connection is made in this back sensor region 1717 and is illustrated as a rectangle of metal.

Figure 15:
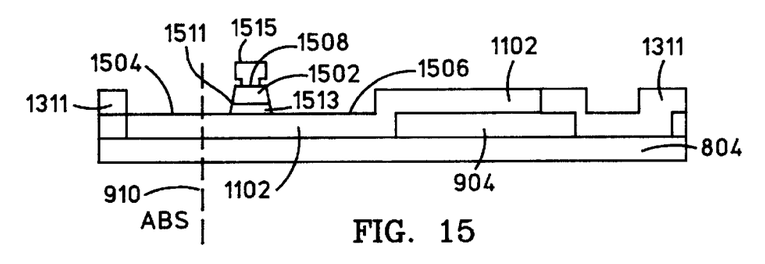
FIG. 15 is a cross-sectional view of that shown in FIG. 14A except that a recessed sensor portion is formed behind the ABS with use of another masking and milling process.

Similar to the track width defining process, an additional masking and ion milling process is then performed using a suitable conventional mask 1515 as shown in FIG. 15 to define stripe height (SH) of the sensor. In this process, portions of magnetic pinned layer 1302 and barrier layer 1202 (FIGS. 12 and 15) are removed to form a recessed sensor portion 1502 (or sensor stack). By "recessed", it is meant that sensor portion 1502 is recessed away from contemplated ABS line 910 (and the ABS itself once the head is completely formed). Preferably, a frontmost edge 1511 of recessed sensor portion 1502 is positioned away from contemplated ABS line 910 by a distance between about 25–1000 nanometers, and more preferably at a distance of about 75 nanometers. The width of recessed sensor portion 1502 may be around 75 nanometers. Surrounding areas 1504 and 1506 of recessed sensor portion 1502 expose surfaces or top end portions of free layer 1102. Note that free layer 1102 extends beyond a rearmost edge 1513 of recessed sensor portion 1502. Free layer 1102 may extend away from rearmost edge 1513 of recessed sensor portion 1502 at a distance greater than 100 nanometers, for example. As an alternative process, the definition of the SH can precede the definition of the track width, as previously stated.

Figure 16A:
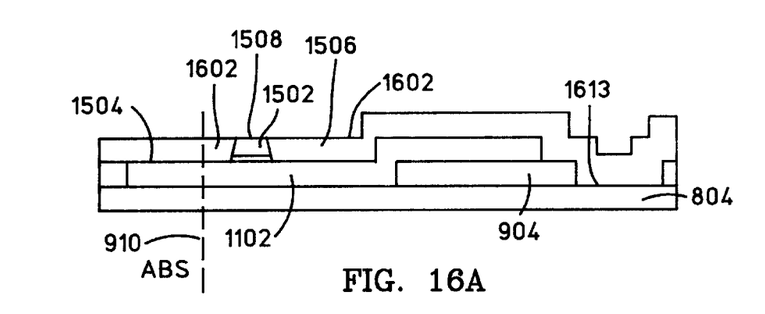
FIG. 16A is a cross-sectional view of that shown in FIG. 15 except that an insulator is formed over the exposed free layer and surrounds the recessed sensor portion.
Figure 16B:
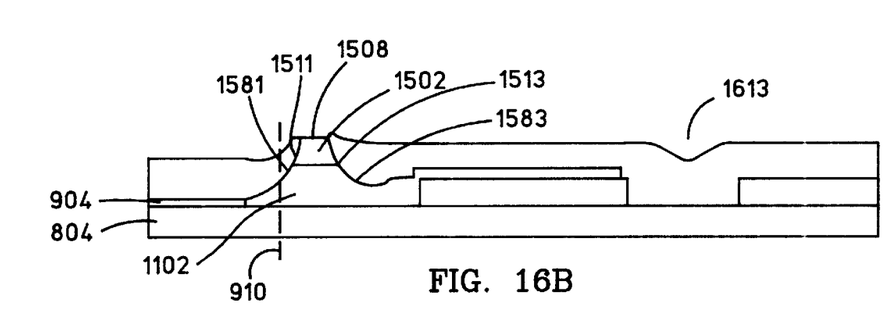
FIG. 16B is a cross-sectional view of that shown in FIG. 16A except that an insulator is deposited coplanar to the sensor structure with the mask removed with a possible sensor profile if formed by milling, and where an additional via to the substrate along plane X—X of FIG. 14A is also shown.
Figure 16C:
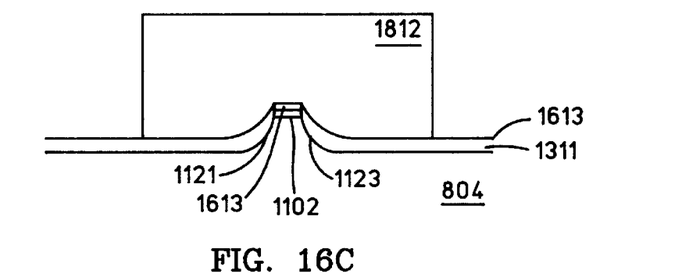
FIG. 16C is an ABS view of the sensor portion of the slider where only a portion of free layer is exposed and a refilled oxide layer separates the emitter lead from the semiconductor substrate.

In FIG. 16A, it is shown that an insulator 1602, such as alumina ($Al_2O_3$), is deposited over the structure so as to form over surrounding areas 1504 and 1506 as well as over the sides of recessed sensor portion 1502. Removal of photoresist structure 1515 (FIG. 15) or planarization may be performed to fully expose a top 1508 of recessed sensor portion 1502. In FIG. 16B, a similar structure is shown where the edges of the sensor defined by milling will have a curvature to the front side 1581 and the rear side 1583. This curvature is also viewable in the track width cross-section of sensor on left side 1121 and right side 1123 of the SVT. At a short distance to the ABS, the amount of curvature of the removed sensor can influence the amount of recession of sensor. In addition, the amount of curvature along with the amount of refilled oxide 1613 can affect the maximum linear density of the read head. In FIG. 16C, an ABS view of the sensor portion of the slider is shown where only a portion of free layer 1102 is exposed and a refilled oxide layer(s) (1311 and/or 1613) separate emitter lead 1812 from semiconductor substrate 804.

Figure 17:
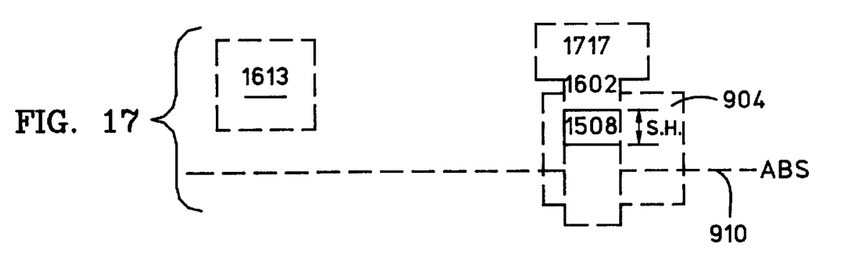
FIG. 17 is a top down view of the wafer at this point in the process.

FIG. 17 shows a top plan view of the structure after the deposition of insulator 1602. The mill and refill process defines the stripe height (S.H.) or the extent of the pinned layer from the ABS, perpendicular to contemplated ABS line 910. This leaves a small portion of top 1508 of the sensor stack exposed on the wafer surface. Vias are subsequently patterned and etched to make connection to the collector and base.

Figure 18:
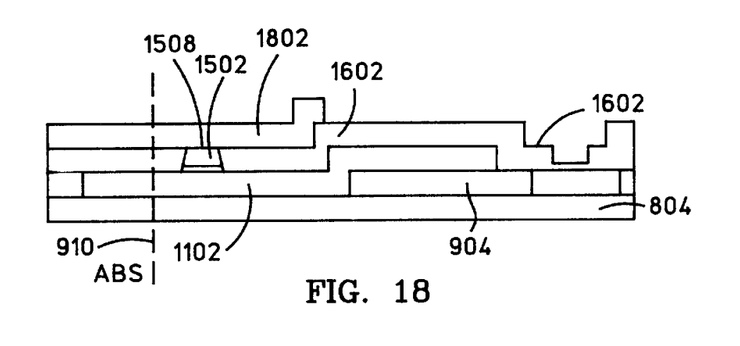
FIG. 18 is a cross-sectional view of that shown in FIG. 16A except that a lead layer is formed over the top of recessed sensor portion and insulator.
Figure 19:
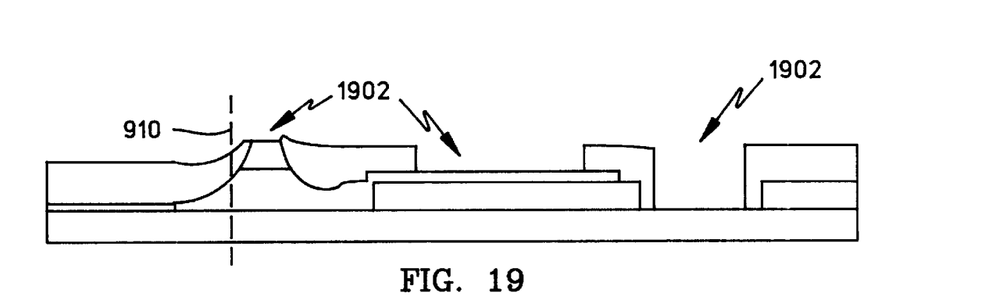
FIG. 19 is a cross-sectional view of FIG. 16B except that vias are etched through the insulation layer to expose the free layer and/or the substrate, and where an additional via to the substrate along plane X—X of FIG. 14A is also shown.
Figure 20:
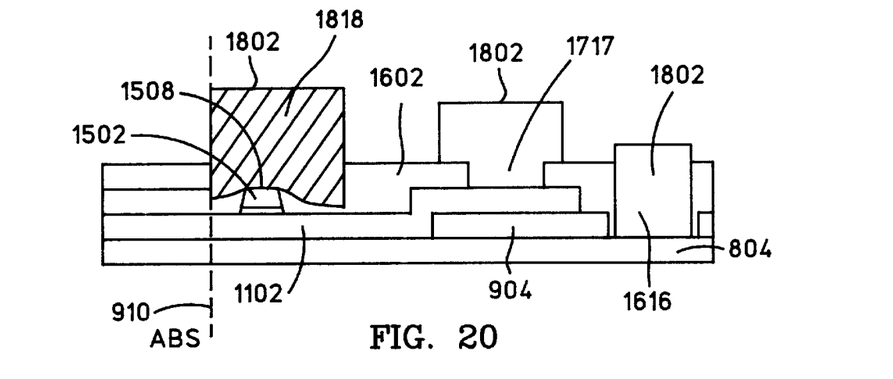
FIG. 20 is a cross-sectional view of that shown in FIG. 18 with the lead layer formed into leads.
Figure 21:
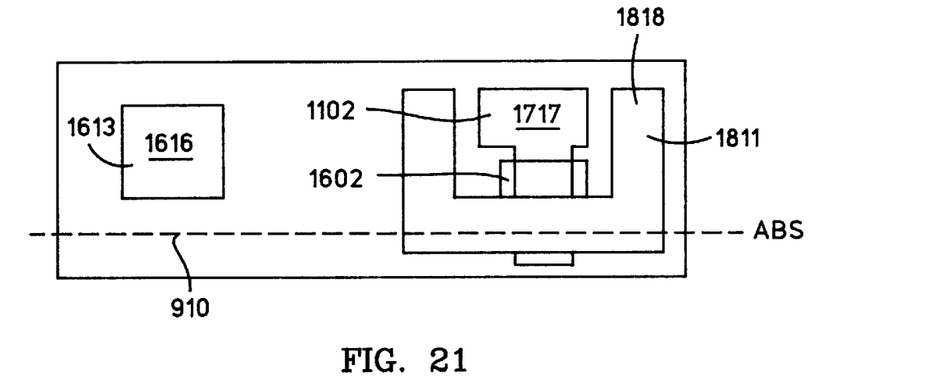
FIG. 21 is a top plan view of that shown in FIG. 20.

Next, in relation to FIG. 18, lead layers 1802 are deposited over insulator 1602 and top 1508 of recessed sensor portion 1502. Top 1508 of recessed sensor portion 1502 makes physical contact with lead layer 1802. Preferably, lead layers 1802 are formed of nickel-iron (NiFe), and are deposited to a thickness between about 100 and 3000 nanometers and more preferably at a thickness of about 2000 nanometers. In FIG. 20, lead layers 1802 are patterned and formed into leads for all three terminals of the device. A top plan view of this is shown in FIG. 21. Preferably, lead layers 1802, which form the emitter of the SVT, also constitute a magnetic shield for an emitter lead 1811 of the device.

Alternatively, a lead layer to the SVT may be fabricated out of a single layer of material. This is shown and described in relation to FIG. 19. Vias 1902 can be formed to expose connections to the base, collector, and emitter of the SVT. Magnetic lead layer 1812 for the emitter can be fabricated out of the same material (e.g. NiFe) and serve as a magnetic shield. This is accomplished in the same manner as fabricating lead layer 1802 (FIG. 18) after the magnetic shield. More particularly, a full film seedlayer is deposited followed by masking and electroplating steps; the mask, seedlayer, and unwanted plated material are removed in subsequent processing steps. This will leave large plated vias as shown in FIG. 20. The top down view of the SVT in FIG. 21 shows that the plated vias will partially cover a via to substrate 1616, a via to free layer 1717, and a metal layer connected to pinned layer 1818.

Figure 22:
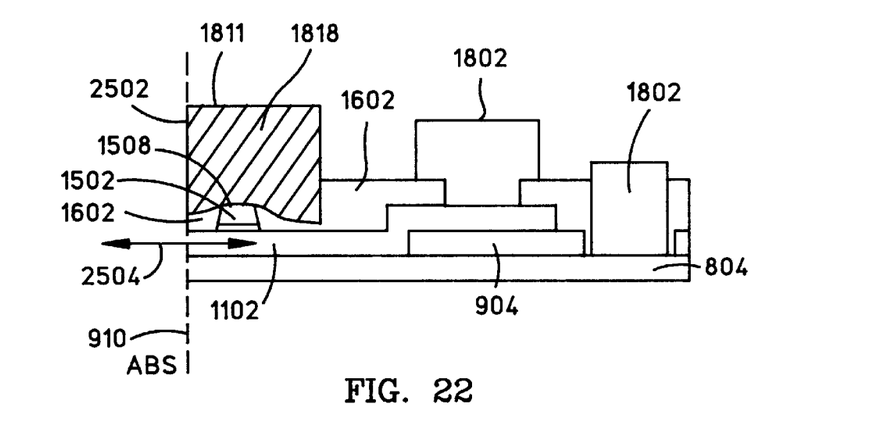
FIG. 22 is a cross-sectional view of that shown in FIG. 20 except that the structure has been cut to form an edge of an air bearing surface (ABS)

In FIG. 22, it is shown that the resulting structure is partially cut along contemplated ABS line 910 to form an edge 2502 for the ABS. Here, mechanical lapping or CMP is performed to make edge 2502 smooth and flush as the ABS. As shown, the frontmost edge of free layer 1102 is flush with edge 2502 along the ABS. On the other hand, recessed sensor portion 1502 is recessed away from the ABS. A portion of insulator 1602 is disposed between recessed sensor portion 1502 and the ABS, and it has a frontmost edge which is flush with the ABS. Thus, the only exposed sensor layer at the ABS is the free layer (or a stack containing the free layer) which is thinner than the recessed device. Free layer 1102 serves as a flux guiding structure for flux 2504 at the media interface. Advantageously, since free layer 1102 serves as a flux guiding structure for the sensor, the sensor has a thinner profile at the ABS to accommodate higher recording densities. This is also made possible by the decreased spacing between the free layer and the shield at the ABS.

Figure 23:
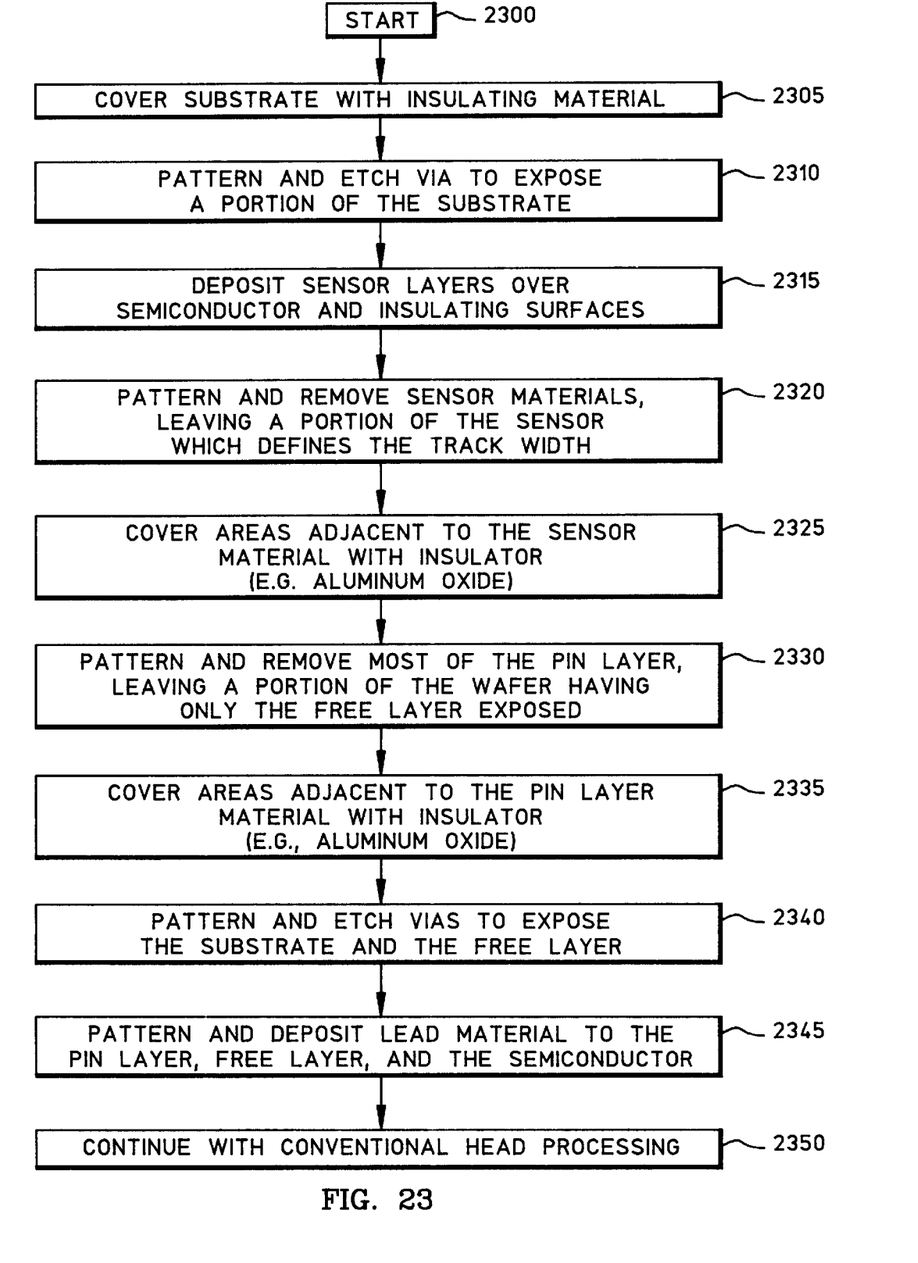
FIG. 23 is a flowchart which provides a summary of the method of making the SVT.

FIG. 23 is a flowchart which is a summary of the above-described detailed method of forming the SVT. Beginning at a start block 2300, a semiconductor substrate is covered with an insulating material (step 2305). Next, a via is patterned and etched to expose a portion of the substrate (step 2310). Sensor layers are then deposited over the substrate and insulating surfaces (step 2315). Patterning and removal of sensor material is then performed, which leaves a portion of the sensor which defines the track width (step 2320). Next, areas adjacent to the sensor material are covered with an insulator, such as aluminum oxide (step 2325). Patterning and removal of most of the pinned layer is then performed, which leaves a portion of the wafer having only the free layer exposed (step 2330). Next, areas adjacent to the pinned layer material are covered with an insulator, such as aluminum oxide (step 2335). Vias are then patterned and etched to expose the substrate and the free layer (step 2340). Lead material is deposited and patterned to the pinned layer, free layer, and the semiconductor substrate (step 2345). Conventional head processing is then performed to complete formation of the head.

Figure 24:
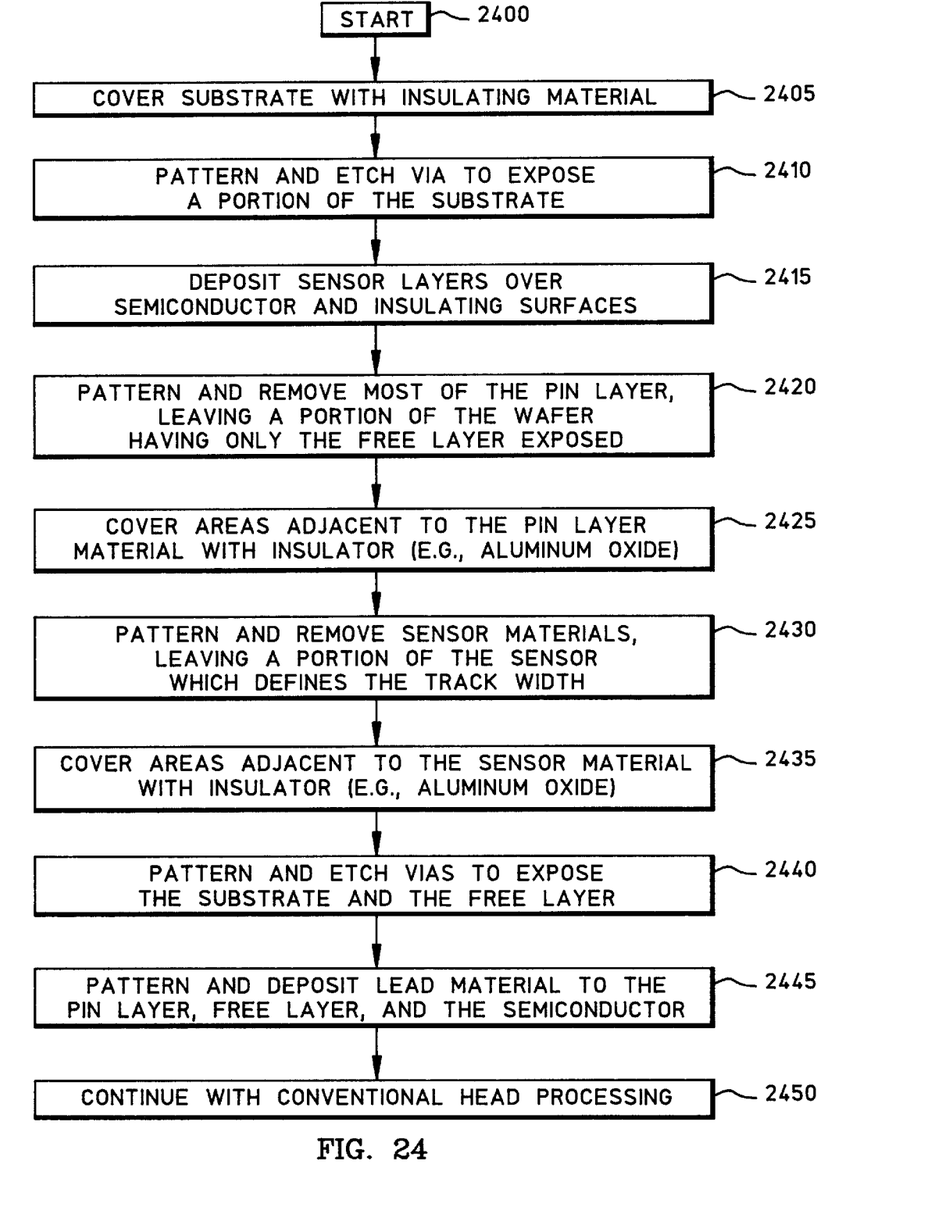
FIG. 24 is another flowchart which provides an alternative method of making the SVT.

FIG. 24 is another flowchart which describes a method of forming the SVT which is similar to that described above. Beginning at a start block 2400, a semiconductor substrate is covered with an insulating material (step 2405). Next, a via is patterned and etched to expose a portion of the substrate (step 2410). Sensor layers are then deposited over the substrate and insulating surfaces (step 2415). Patterning and removal of most of the pinned layer is then performed, which leaves a portion of the wafer having only the free layer exposed (step 2420). Next, areas adjacent to the pinned layer material are covered with an insulator, such as aluminum oxide (step 2425). Patterning and removal of sensor material is then performed, which leaves a portion of the sensor which defines the track width (step 2430). Next, areas adjacent to the sensor material are covered with an insulator, such as aluminum oxide (step 2435). Vias are then patterned and etched to expose the substrate and the free layer (step 2440). Lead material is deposited and patterned to the pinned layer, free layer, and the semiconductor substrate (step 2445). Conventional head processing is then performed to complete formation of the head. The difference between the processes manifests itself in the edge definition and interface between the refilled alumina (as described in steps 2425 and 2435).

Thus, a unique SVT for a magnetoresistive sensor has been described. The SVT includes a free layer formed over a semiconductor material and a magnetic pinned layer formed over a portion of the free layer. The free layer has an edge that is substantially flush with a media interface whereas the magnetic pinned layer has an edge that is recessed away from the media interface. The free layer advantageously serves as a flux guiding structure for the SVT. Preferably, the first end of the magnetic pinned layer is recessed away from the media interface between about 25–1000 nanometers. Using the SVT in a magnetic head for a disk drive, the media interface includes the ABS. The free layer is formed of a magnetic material, such as nickel-iron or cobalt-iron, the magnetic pinned layer is formed of either nickel-iron or cobalt-iron (and may contain an anti-ferromagnet), and the semiconductor material is formed of either silicon, silicon-oxide, silicon coated with oxide, silicon coated with nitride, or silicon coated with an insulator. A thin barrier layer may be formed between the magnetic pinned layer and the free layer, a lead layer may be formed over the magnetic pinned layer, and an insulator layer which surrounds the magnetic pinned layer and has an edge that is substantially flush with the media interface may also be utilized. The sensor may be incorporated into a slider body which is formed from the semiconductor material. Further, the sensor may be incorporated into a disk drive which includes a spindle for supporting and rotating a magnetic disk and the slider body for supporting a magnetic head to read data from the magnetic disk. Alternatively, the sensor may be incorporated into other magnetic storage devices, such as a magnetic tape storage device.

A method of forming the SVT includes the acts of depositing a free layer over a semiconductor material; depositing a magnetic pinned layer over the free layer; masking and milling the magnetic pinned layer such that end portions of the magnetic pinned layer are removed and a central portion of the magnetic pinned layer remains, thereby exposing end surface portions of the free layer; and cutting and forming the ABS such that an edge of the free layer is substantially flush with the ABS and an edge of the magnetic pinned layer is recessed away from the ABS. The method may include one or more further acts such as: prior to depositing the free layer, patterning a hole in the semiconductor material in which the free layer is subsequently deposited; prior to the act of depositing the magnetic pinned layer, depositing a barrier layer over the free layer; prior to the act of cutting and forming the ABS, depositing an insulator over end portions of the free layer which remain exposed after the masking and milling; and depositing a lead layer over the insulator and the central portion of the magnetic pinned layer.

Advantageously, the only exposed sensor layer at the ABS is the free layer (or a stack containing the free layer) which is thinner than the recessed device. The recessed sensor portion is recessed away from the ABS and the free layer serves as a flux guiding structure at the media interface. Because of this, the sensor has a thinner profile at the media interface to accommodate higher recording densities.

It is to be understood that the above is merely a description of preferred embodiments of the invention and that various changes, alterations, and variations may be made without departing from the true spirit and scope of the invention as set for in the appended claims. For example, the sensor may be incorporated into other magnetic storage devices, such as a magnetic tape storage device. None of the terms or phrases in the specification and claims has been given any special particular meaning different from the plain language meaning to those skilled in the art, and therefore the specification is not to be used to define terms in an unduly narrow sense.

What is claimed is:

1. A spin valve transistor (SVT) of a magnetoresistive sensor, comprising:

a free layer formed over a semiconductor material layer;

an emitter layer formed over a portion of the free layer;

the free layer having an edge that is substantially flush with a media interface;

the emitter layer having an edge that is recessed away from the media interface; and lead terminals of the SVT coupled to the free layer, the emitter layer, and the semiconductor material layer.

2. The SVT of claim 1, wherein the free layer serves as a flux guiding structure for the SVT.

3. The SVT of claim 1, wherein the free layer comprises a ferromagnet (FM).

4. The SVT of claim 1, wherein the free layer comprises one of nickel-iron and cobalt-iron.

5. The SVT of claim 1, wherein the edge of the emitter layer is recessed away from the media interface between about 25–1000 nanometers.

6. The SVT of claim 1, wherein the emitter layer comprises a ferromagnetic (FM) pinned layer.

7. The SVT of claim 6, wherein the FM is exchanged coupled to an antiferromagnet (AFM) layer.

8. The SVT of claim 1, wherein the emitter layer comprises at least one of cobalt-iron and nickel-iron.

9. The SVT of claim 1, wherein the semiconductor material layer comprises one of silicon, silicon-oxide, silicon coated with oxide, silicon coated in nitride, and silicon coated with an insulator.

10. The SVT of claim 1, further comprising:

a barrier layer formed between the emitter layer and the free layer.

11. The SVT of claim 1, further comprising:

a non-magnetic spacer positioned between the free layer and the emitter layer.

12. The SVT of claim 1, further comprising:

the semiconductor material layer comprising a slider body.

13. The SVT of claim 1, wherein the free layer is adjacent to the semiconductor material layer.

14. The SVT of claim 1, wherein the lead terminal coupled to the emitter layer comprises nickel-iron.

15. The SVT of claim 1, wherein the lead terminal coupled to the emitter layer comprises a magnetic shield.

16. The SVT of claim 1, further comprising:

an insulator layer which surrounds and is substantially coplanar with the emitter layer and has an edge that is substantially flush with the media interface.

17. The SVT of claim 1, wherein the media interface comprises an air bearing surface (ABS).

18. A slider for a disk drive, comprising:

a slider body formed from a semiconductor material;

a free layer formed over the semiconductor material;

an emitter layer formed over a portion of the free layer;

the free layer having an edge that is substantially flush with an air bearing surface (ABS);

the emitter layer having an edge that is recessed away from the ABS; and lead terminals coupled to the free layer, the emitter layer, and the semiconductor material of the slider body.

19. The slider of claim 18, wherein the free layer serves as a flux guiding structure at the ABS.

20. The slider of claim 18, wherein the edge of the emitter layer is recessed between about 25–1000 nanometers away from the ABS.

21. The slider of claim 18, wherein the semiconductor material comprises one of silicon, silicon-oxide, silicon coated with oxide, silixon coated in nitride, and silicon coated with an insulator.

22. The slider of claim 18, further comprising:

a barrier layer formed between the emitter layer and the free layer.

23. The slider of claim 18, further comprising:

an insulator layer which surrounds and is substantially coplanar with the emitter layer and has an edge that is substantially flush with the ABS.

24. The slider of claim 18, further comprising:

the free layer being formed between the emitter layer and the semiconductor material layer.

25. The slider of claim 18, wherein the lead terminal coupled to the emitter layer comprises a magnetic shield.

26. The slider of claim 18, wherein the lead terminal coupled to the emitter layer comprises nickel-iron.

27. A disk drive, comprising:

a spindle for supporting and rotating a magnetic disk;

a slider for supporting a magnetic head which reads data from the magnetic disk;

a free layer being formed over a semiconductor material;

an emitter layer being formed over a portion of the free layer;

the free layer having an edge that is substantially flush with an air bearing surface (ABS) between the magnetic head and disk;

the emitter layer having an edge that is recessed away from the ABS;

wherein the free layer, the emitter layer, and the semiconductor material comprise a spin valve transistor (SVT) of the magnetic head;

lead terminals of the SVT coupled to the free layer, the emitter layer, and the semiconductor material; and wherein the free layer serves as a flux guiding structure for the SVT.

28. The disk drive of claim 27, wherein the emitter layer comprises a magnetic pinned layer.

29. The disk drive of claim 28, wherein the edge of the emitter layer is recessed between about 25–1000 nanometers away from the ABS inside the slider.

30. The disk drive of claim 27, wherein the semiconductor material comprises one of silicon, silicon-oxide, silicon coated with oxide, silicon coated with nitride, and silicon coated with an insulator.

31. The disk drive of claim 27, further comprising:

a barrier layer formed between the emitter layer and the free layer.

32. The disk drive of claim 27, further comprising:

an insulator layer which surrounds and is substantially coplanar with the emitter layer and has an edge that is substantially flush with the ABS.

33. The disk drive of claim 27, further comprising:

the free layer formed adjacent the semiconductor material of the slider body.

34. The disk drive of claim 27, wherein the lead terminal coupled to the emitter layer comprises a magnetic shield.

35. The disk drive of claim 27, wherein the semiconductor material comprises the slider.

* * * * *